United States Patent [19]

Lee et al.

[11] Patent Number: 4,667,220

[45] Date of Patent: May 19, 1987

[54] SEMICONDUCTOR CHIP MODULE INTERCONNECTION SYSTEM

[75] Inventors: James C. K. Lee, Los Altos; Gene M. Amdahl, Atherton; Carlton G. Amdahl, Saratoga; Richard L. Beck, Cupertino, all of Calif.

[73] Assignee: Trilogy Computer Development Partners, Ltd., Cupertino, Calif.

[21] Appl. No.: 605,018

[22] Filed: Apr. 27, 1984

[51] Int. Cl.⁴ .................. H01L 23/48; H01L 23/52; H01L 23/40; H01L 23/12

[52] U.S. Cl. ......................................... 357/68; 357/82; 357/80; 357/74

[58] Field of Search .................... 357/81, 75, 80, 68, 357/71, 74

[56] References Cited

U.S. PATENT DOCUMENTS 4,407,007 9/1983 Desai et al. ........................ 357/74
4,551,747 11/1985 Gilbert et al. ..................... 357/68

OTHER PUBLICATIONS

"Microelectronic Packaging"—Blodgett, Jr.—*Scientific American Magazine*, Jul. 1983, vol. 249, No. 1, pp. 88–96.
"Integrated Circuit Package and Heat Sink—Tiffany—*IBM Technical Disclosure Bulletin*—Tiffany—vol. 13, No. 1, Jun. 1970, p. 58.
"Electrically Conductive Array in an Elastomeric Material"—Newmann et al.—*IBM Technical Disclosure Bulletin*, vol. 25, No. 4, Sep. 1982, p. 1801–1802.
"Distribution System for Multilayer Ceramic Modules'-'—Markewycz—*IBM Technical Disclosure Bulletin*—vol. 19, No. 4, Sep. 1976, pp. 1270–1271.

*Primary Examiner*—Andrew J. James
*Assistant Examiner*—S. V. Clark
*Attorney, Agent, or Firm*—Townsend & Townsend

[57] ABSTRACT

A module for a semiconductor chip having a front face with a two dimensional array of power, ground and signal contacts is disclosed. Power, ground and signal conductors extend from the respective contacts on the front face of the chip. A pair of electrically conductive plates are parallel to the front face of the chip and located at the termination of the conductors. The plate nearer the conductors is electrically coupled to either the power or ground conductors, and contains apertures corresponding to the remaining ground or power conductors and to the signal conductors. A plurality of discrete signal transmission members are located at a surface of the plate farther from the conductors. The ground or power conductors not connected to the near plate are electrically coupled to the far plate through certain of the apertures, and the signal conductors are coupled to the respective signal transmission members through the remaining apertures.

44 Claims, 15 Drawing Figures

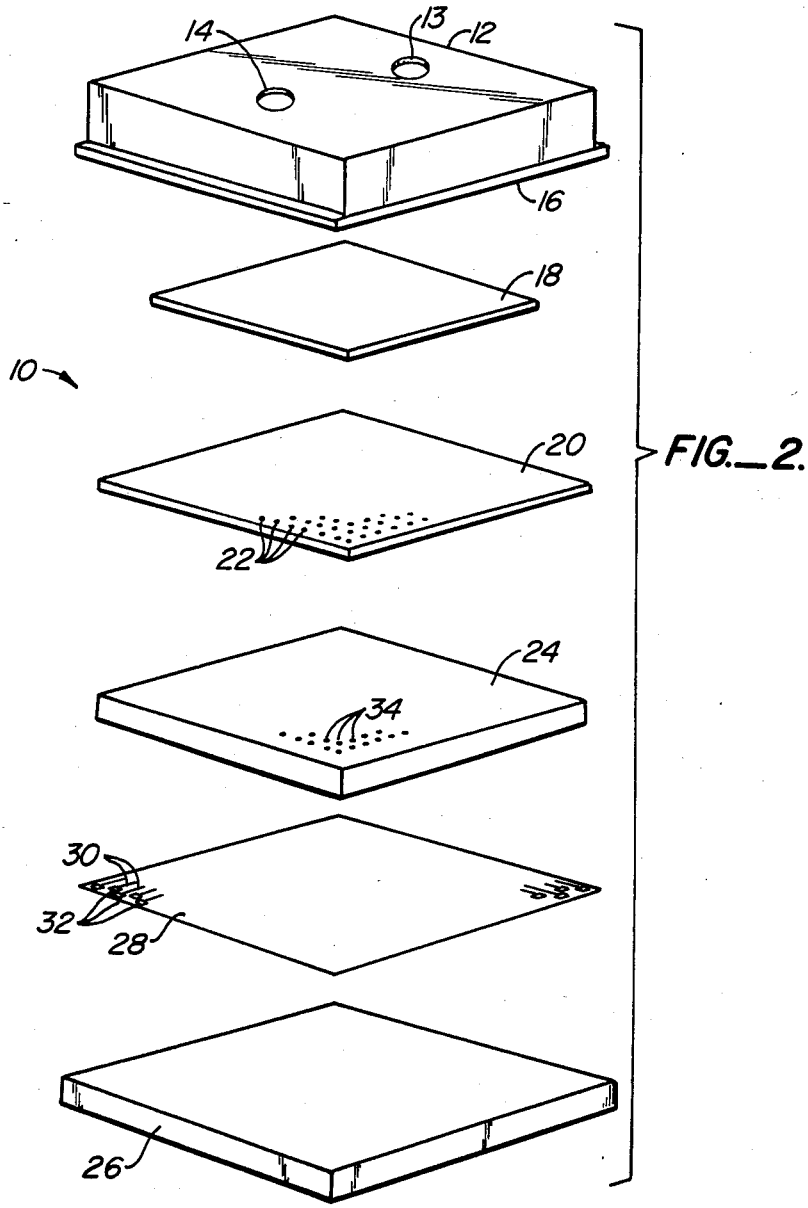
FIG._1.
FIG._2.

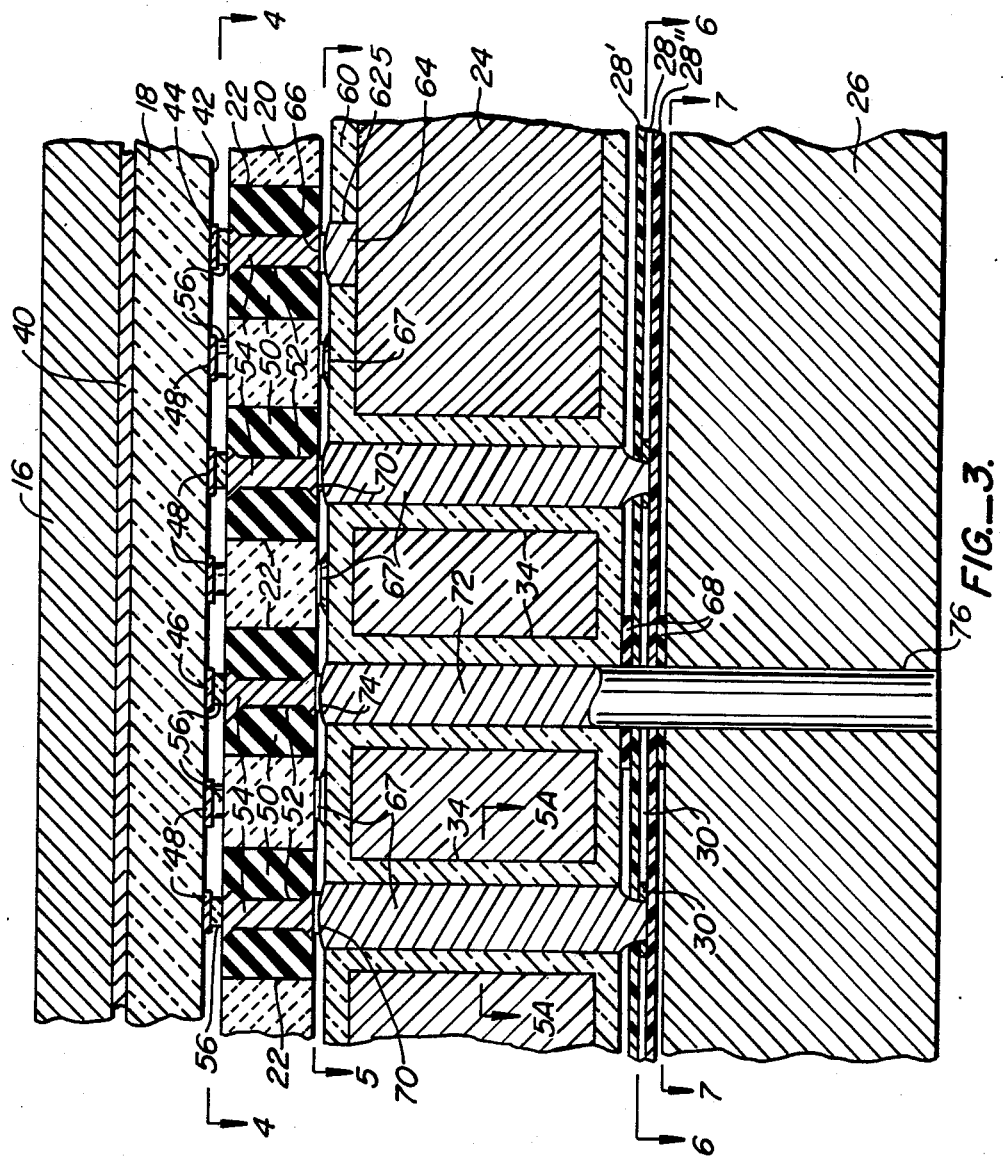
FIG._3.

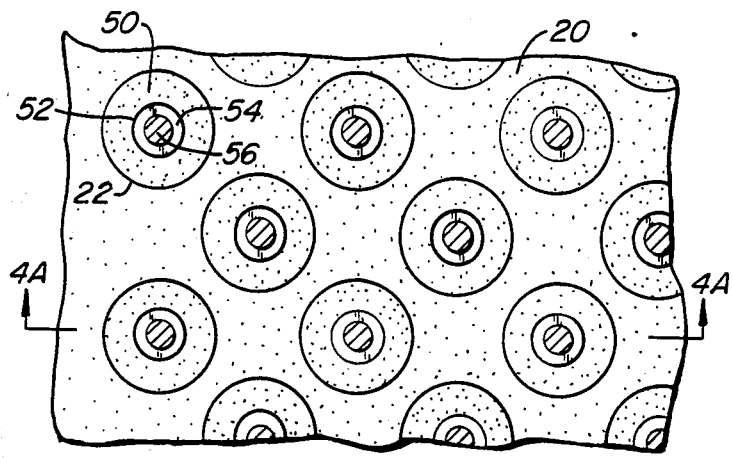
FIG._4.
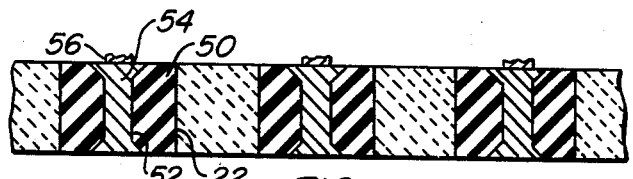
FIG._4A.
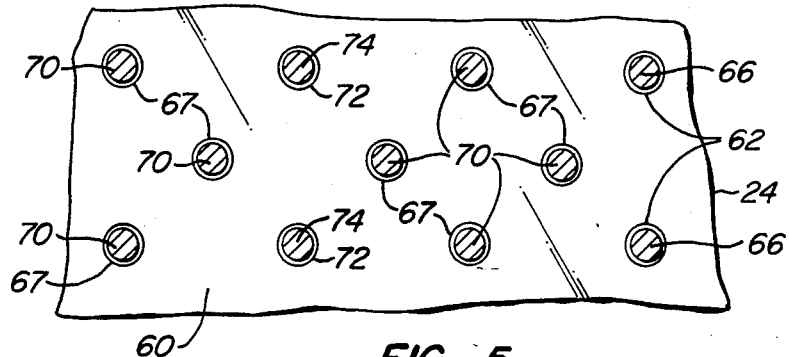
FIG._5.
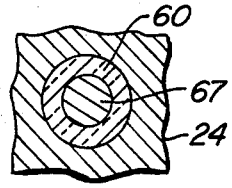
FIG._5A.

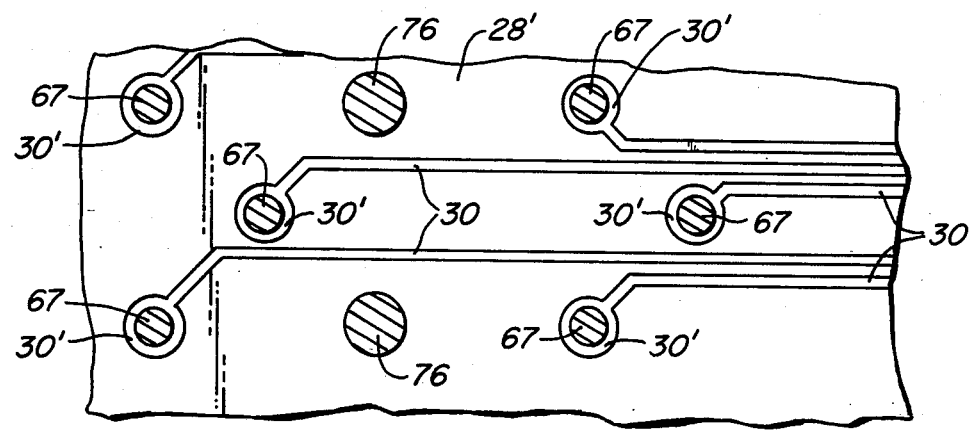
FIG._6.
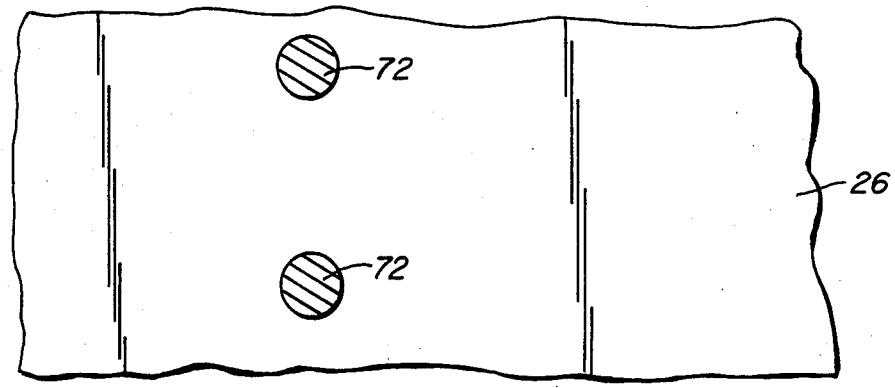
FIG._7.

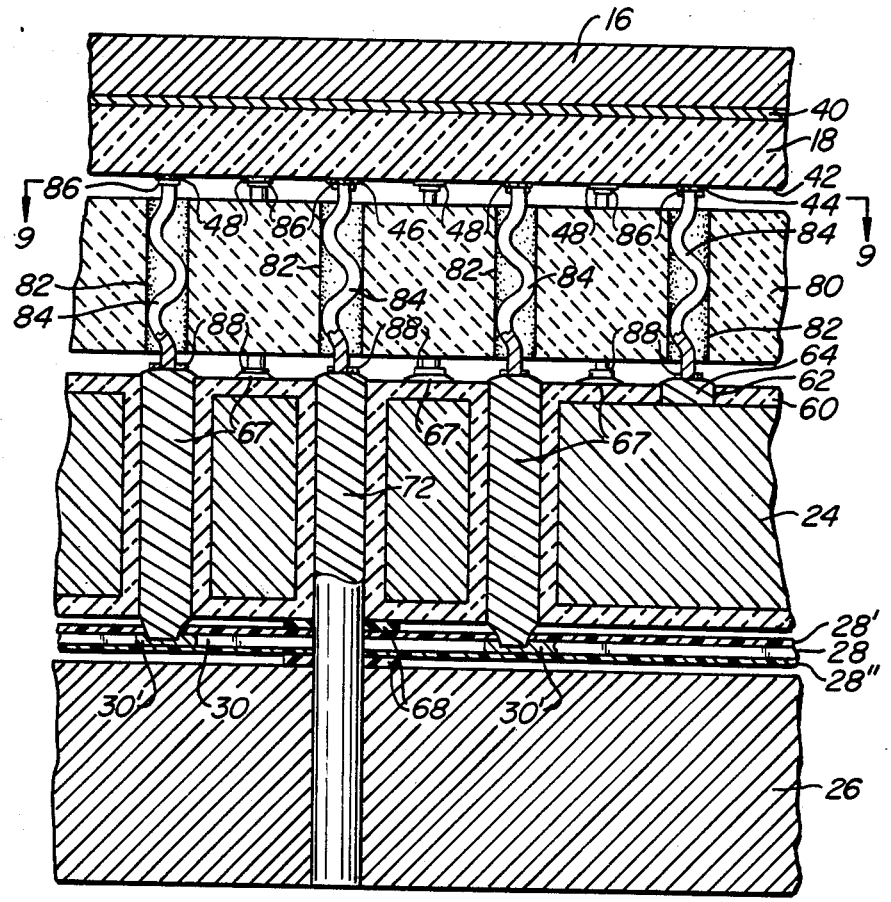
FIG._8.
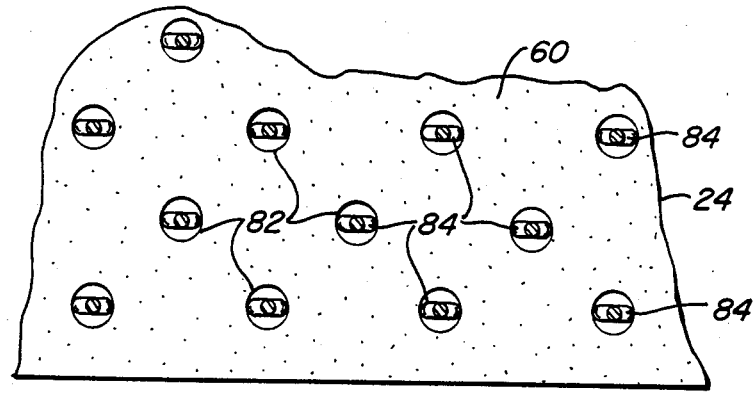
FIG._9.

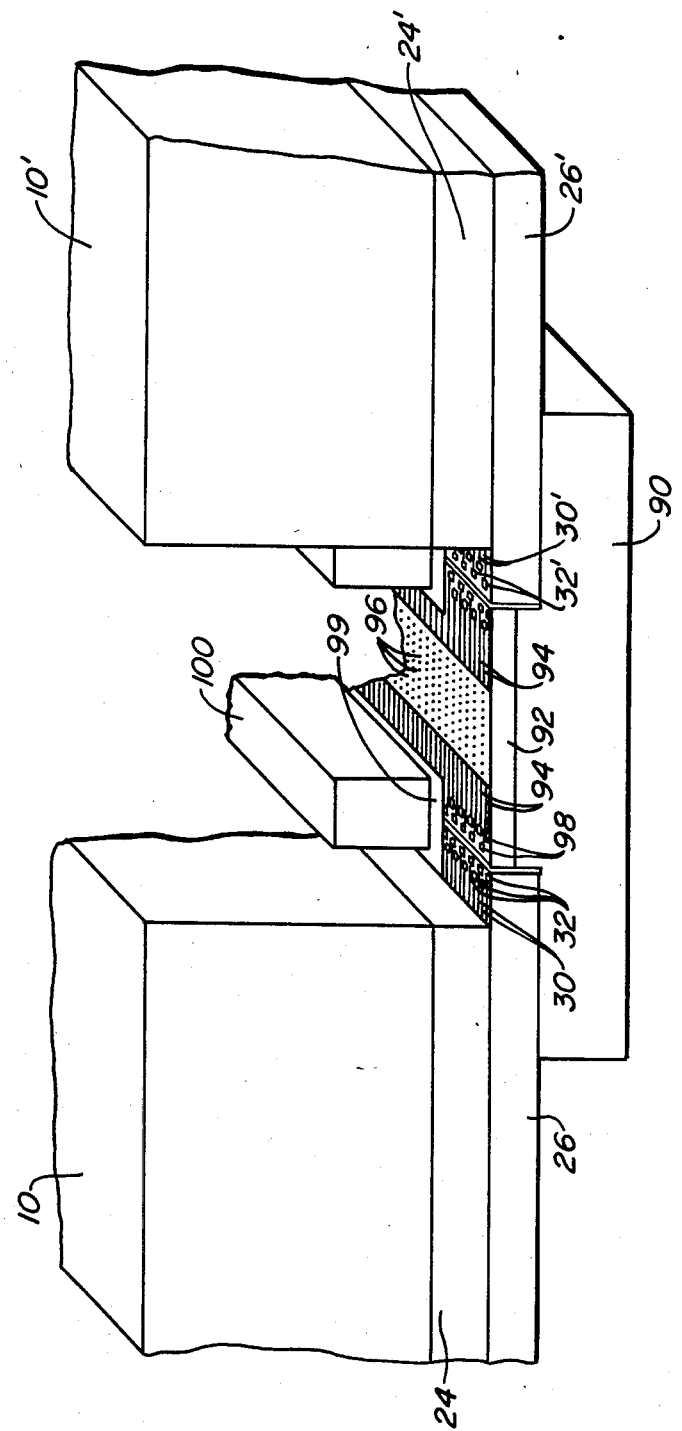
FIG._10.

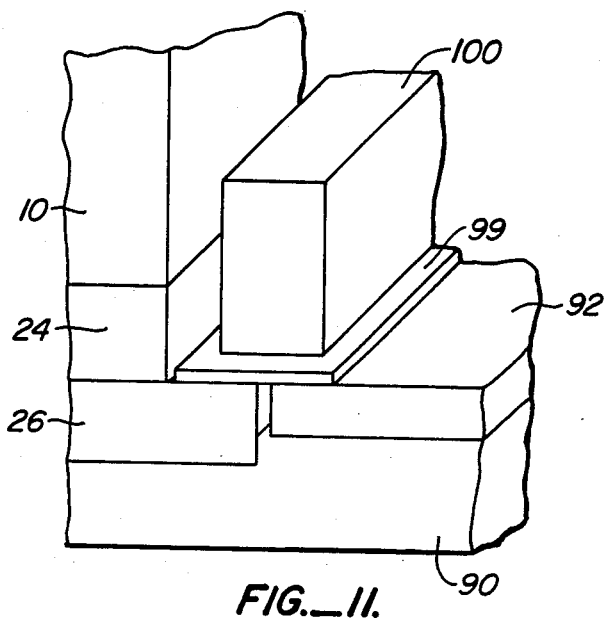
FIG._11.
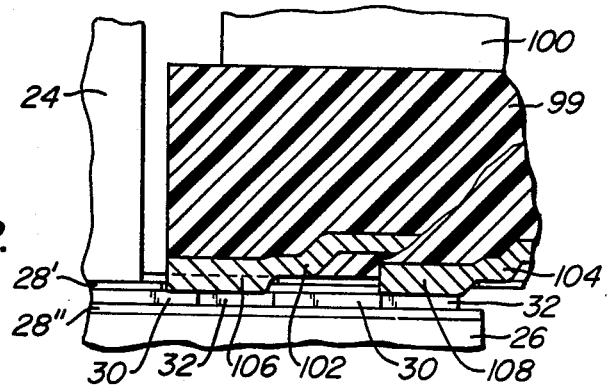
FIG._12.
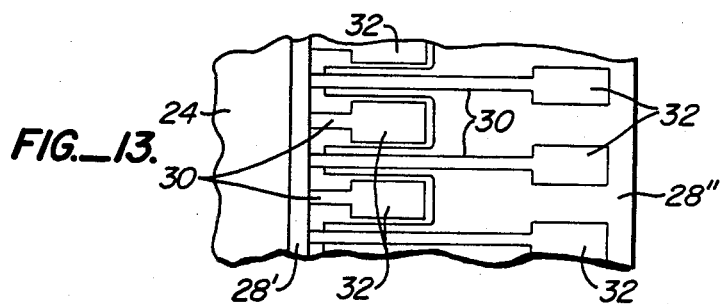
FIG._13.

SEMICONDUCTOR CHIP MODULE INTERCONNECTION SYSTEM

BACKGROUND OF THE INVENTION

The present invention relates to the connection of a semiconductor chip to sources of power and ground, and to signal leads connecting to other elements in a computer system.

At the present time, computers other than very small computers utilize a large number of small chips to perform logic and memory functions. Significant spacing is generally provided between the chips because of the necessity of heat dissipation. Each chip contains numerous logic and/or memory circuits, and the circuits on the various chips communicate with one another and with other elements in the system by means of signals. The signals are carried by conductors which interconnect the various elements in the system, and the transmission time for each particular signal is significant relative to the overall computation speed of a computer because of the spacing between the various chips and other elements. Considering the high volume of signals that must be exchanged, the aggregate transmission time for the numerous signals transmitted represents a very substantial limitation on overall system speed.

One technique for at least partially resolving the system speed limitations arising from the use of a large number of small chips is the substitution of a relatively fewer number of large chips for the numerous small chips. When large chips are employed, many of the communications between various logic and memory circuits will be made between circuits on the same chip, and because of the close proximity of the 7 circuit elements the transmission time is virtually nil.

One of the difficulties in the utilization of large chips, however, is the fact that the various circuit elements must communicate with one another. The circuit elements must have sources of power and ground as well, and the power and ground connections must be well insulated, especially for a bipolar chip where voltages are relatively high. Typically, contacts are provided about the periphery of a chip, with the various circuit elements exchanging signals, receiving power and providing a ground through these contacts. When the dimensions of the chip are increased, the number of circuit elements which can be accommodated on a given chip rises much more rapidly than the number of contacts which can be accommodated about its periphery. Also, the necessity of providing transverse leads from the circuits to the edge of the chip adds complexity to an already complex device.

Attempts have been made to construct semiconductor chips with a two dimensional array of contacts, to solve the problem of providing transverse leads and sufficient peripheral contacts when the size of the chip is enlarged. To connect such a chip to other elements, the chip is typically located substantially flush with a printed circuit board or other flat surface with multiple connections, and the chip contacts are coupled to the connections with multiple pinpoint solder connections. However, this system leaves the problem of supplying power and ground and signal connections in a confined space. As a result of this problem, such systems are still limited to relatively small chips, and do not permit the achievement of the desired goal, namely the substitution of a fewer number of large chips for the numerous small chips presently used.

SUMMARY OF THE INVENTION

The present invention provides a module for a semiconductor chip having a front face with a two dimensional array of power, ground and signal contacts. Power, ground and signal conductors extend from the respective contacts on the front face of the chip. A pair of electrically conductive plates are parallel to the front face of the chip and located at the termination of the conductors. The plate nearer the conductors is electrically coupled to either the power or ground conductors, and contains apertures corresponding to the remaining ground or power conductors and to the signal conductors. A plurality of discrete signal transmission members are located at a surface of the plate farther from the conductors. The ground or power conductors not connected to the near plate are electrically coupled to the far plate through certain of the apertures. The signal conductors are coupled to the respective signal transmission members through the remaining apertures.

It is preferred that the signal transmission members be leads enclosed between parallel layers of electrically insulative film located between the plates. The leads extend outwardly to exposed, enlarged ends at the periphery of the module. An engineering change board having change leads corresponding to the signal leads can be located adjacent the module, and the respective leads are coupled to one another by means of a bridge. In this fashion, the signal leads from numerous modules can be coupled together, the engineering change board allowing for reorganization of the connections to achieve particular design objectives.

The two electrically conductive plates are connected to sources of power and ground, typically the power plate being located nearer to the chip. The relatively massive plates can easily accommodate the voltage and current requirements of the chip, even when bipolar technology is used. Further, the signal leads are spread out to facilitate connection with the signal leads of other elements of the system.

The combination of the power and ground plates with the dispersed signal connections eliminates the need for a printed circuit board to handle communications with the chip. In an embodiment of the present invention with pins a printed circuit board is used for signal connections, but the complexity of the printed circuit board is substantially reduced by the lack of any requirement that the printed circuit board carry power and ground.

The novel features which are characteristic of the invention, as to organization and method of operation, together with further objects and advantages thereof will be better understood from the following description considered in connection with the accompanying drawings in which preferred embodiments of the invention are illustrated by way of example. It is to be expressly understood, however, that the drawings are for the purpose of illustration and description only and are not intended as a definition of the limits of the invention.

BRIEF DESCRIPTION OF THE DRAWINGS

FIG. 1 is a perspective view of a semiconductor chip module which incorporates a preferred embodiment of the chip interface of the present invention;

FIG. 2 is an exploded view of the module of FIG. 1;

FIG. 3 is an enlarged fragmentary sectional view of the module of FIG. 1;

FIG. 4 is a section view taken along line 4—4 of FIG. 3, and FIG. 4A is a section view taken along lines 4A—4A of FIG. 4;

FIG. 5 is a section view taken along lines 5—5 of FIG. 3, and FIG. 5A is an enlarged fragmentary section view taken along lines 5A—5A of FIG. 3;

FIG. 6 is a section view taken along lines 6—6 of FIG. 3;

FIG. 7 is a section view taken along line 7—7 of FIG. 3;

FIG. 8 is a fragmentary section view of an alternate embodiment of the interface of the invention as incorporated in a module such as that illustrated in FIG. 1;

FIG. 9 is a section view taken along lines 9—9 of FIG. 8.

FIG. 10 is a perspective view illustrating the connection of embodiments of the module of FIG. 1;

FIG. 11 is an enlarged perspective view of the bridge forming portion of the connection of FIG. 10;

FIG. 12 is a fragmentary, enlarged section view of the bridge of FIG. 10.

FIG. 13 is a fragmentary plan view of the signal lead ends of the embodiment of FIG. 1.

DESCRIPTION OF THE PREFERRED EMBODIMENT

A semiconductor chip module 10 containing the features of the present invention is illustrated generally by way of reference to FIGS. 1 and 2. Module 10 includes a heat sink 12 with a fluid inlet 13 and fluid outlet 14 through which a cooling fluid such as water is circulated. A cold plate 16 is located at the base of heat sink 12, and has a flat underlying surface to which a semiconductor chip 18 is secured. In the preferred embodiment of the present invention, chip 18 is a single, large, wafer scale chip having dimensions on the order of 60 by 60 millimeters for a total area of 3,600 square millimeters. Bipolar chips of such dimensions require active cooling such as that provided by heat sink 12, but it is contemplated that a semiconductor chip constructed with CMOS technology could be utilized in the context of this invention and that passive cooling would be sufficient.

The exposed, front surface of semiconductor chip 18, opposite from the back surface which is secured to cooling plate 16, has a two dimensional array of power, ground and signal contacts which are illustrated hereinafter. A connector plate 20 of rigid material, typically a plastic, ceramic or other electrically insulative material, is juxtaposed to the front surface of semiconductor chip 18. Connector plate 20 has a plurality of apertures 22 juxtaposed to and corresponding with the respective power, ground and signal contacts on chip 18. Conductors extend through apertures 22, as will be illustrated in more detail hereinafter.

A power plate 24 is located at the underside of connector plate 20, and is connected to a source of power, typically −0.5 volts. A ground plate 26 is located below power plate 24, and sheet 28 is sandwiched between the power and ground plate. Sheet 28 includes a plurality of enclosed signal leads 30 having enlarged exterior ends 32 about the periphery of the sheet. Power plate 24 has a plurality of apertures 34 which are aligned with and correspond to the apertures 22 in connector plate 20, except for those apertures corresponding to power contacts on chip 18. Each contact on the exposed, front face of chip 18 is electrically connected to power plate 24, ground plate 26 or a signal lead 30 as shown in subsequent drawings.

Referring to FIG. 3, semiconductor chip 18 is attached to the underside of cold plate 16 by a layer of thermally conductive adhesive or solder 40. The exposed face 42 of chip 18 has a two dimensional array of contacts including power contacts such as power contact 44, ground contacts such as ground contact 46, and signal contacts such as signal contacts 48.

Each aperture 22 in connector plate 20 is filled with an elastomeric material 50, preferably silicone rubber (see FIG. 4A). A hole 52 is drilled in elastomeric material 50 to provide a subaperture, and copper 54 or other conductive material is plated in the drilled hole to form a conductor. Because plated conductor 54 is completely surrounded and supported by elastomeric material 50, the conductor is flexible and free to move laterally within limits. A solder connection 56 is provided between each power contact 44, ground contact 46 and signal contact 48 and the associated plated conductor 54 (see FIG. 4) so that the conductor is electrically coupled to its associated contact.

Power plate 24 is constructed of a rigid electrically conductive material, typically metal such as copper. As is evident from FIG. 3, apertures 34 are aligned with and correspond to the apertures 22 in connector plate 20, except that no aperture is located in power plate 24 corresponding to the location of a power contact 44. Power plate 24, including the inside of apertures 34, is fully coated with an electrically insulative material 60. A small aperture 62 is formed in the insulation at a position corresponding to each power contact 44, and a short electrically conductive power post 64 is located in aperture 62. A solder connection 66 is made between each plated conductor 54 connected to a power contact 44 and each power post 64 so that each power contact 44 is electrically coupled to power plate 24 (see FIG. 5).

Medium length electrically conductive signal posts 67 are located in the apertures 34 in power plate 24 corresponding to signal contacts 48 on semiconductor chip 18. Signal posts 67 extend completely through the insulated apertures in the power plate. Sheet 28, which includes a sandwich of thin film layers 28', 28" enclosing leads 30, is spaced from power plate 24 and ground plate 26 by insulated spacers 68. As illustrated in FIG. 6, signal posts 67 penetrate the upper layer 28' of sheet 28, and engage enlarged interior ends 30' of the respective signal leads 30. A solder connection 70 is made between each signal post 67 and a plated conductor 54 joined to a signal contact 48 to provide an electrical connection between the signal contacts and the respective leads 30. One lead 30 is provided for each signal contact 48 and extends to a terminal 32 along an edge of sheet 28.

A long ground post 72 is joined by a solder connection 74 to each plated conductor 54 connected to a ground contact 46 on semiconductor chip 18 (see FIG. 7). Each ground post 72 extends through an insulated aperture 34 in power plate 24, through sheet 28 (without touching any leads 30), and into an aperture 76 in ground plate 26, where it makes intimate contact with the ground plate. Each ground post 72 is constructed of an electrically conductive material, and provides an electrical connection between the respective ground contacts 46 on semiconductor chip 18 and ground plate 26.

An alternate embodiment 80 of the conductor plate of the present invention is illustrated by reference to FIGS. 8 and 9. In this alternate embodiment, the configuration of semiconductor chip 18, and its two dimensional array of power contacts 44, ground contacts 46, and signal contacts 48, is identical to that illustrated with reference to the first embodiment of the conductor plate, and the elements are given identical reference numerals. Similarly, the configuration of power plate 24 and its associated power posts 64, ground plate 24 with ground posts 72, and lead sheet 28 with lead posts 67, is identical to the first embodiment and the elements are also given identical reference numerals.

Connector plate 80 is made of a rigid, electrically insulative material such as plastic or ceramic. A plurality of apertures 82 are formed in connector plate 80, the apertures being aligned with and corresponding to the respective power, ground and signal contacts 44, 46 and 48 on the exposed front surface 42 of semiconductor chip 18. An S-shaped copper wire 84 is located in each aperture 82. Solder connections 86 are made between each wire 84 and an associated power, ground or signal contact 44, 46 or 48. Similarly, at the other end each S-shaped wire 84, a solder connection 88 is made to each power post 64, signal post 67 and ground post 72. Thus, each contact on chip 18 is flexibly and electrically coupled to its associated post, which is in turn electrically coupled to either power plate 24, ground plate 26 or one of the signal leads 30.

The interconnection of two of the semiconductor chip modules of FIG. 1, designated 10 and 10', is illustrated by way of reference to FIG. 10. Both modules 10, 10' have ground plates 26, 26' projecting forwardly beyond power plates 24, 24'. Leads 30, 30' extend beyond power plates 24, 24' overlying ground plates 26, 26', terminating in staggered rows of contacts 32, 32'. Ground plates 26, 26' are located on a support frame 90, which may itself be the ground source.

An engineering change board 92 is located on support frame 90 between modules 10 and 10'. Engineering change board 92 has a plurality of change leads 94 with pins 96 which can be used to alter the path of each change lead. The change leads 94 terminate in enlarged ends 98, which are located in staggered rows that correspond to the enlarged ends 32 of contacts 30, 30'.

A bridge 99 spans the enlarged ends 32 of leads 30 and the enlarged ends 98 of change leads 94 (see FIG. 11). A bar 100 biases bridge 99 against the leads. In FIG. 10, bridge 99 and bar 100 are shown spaced from leads 30 and 94 so that the leads are visible—the installed portion of the bridge and bar are shown in FIG. 11.

As illustrated in FIG. 12, bridge 99 is constructed of a rubber or plastic electrically insulative material having embedded leads 102, 104. Bridge leads 102, 104 terminate in enlarged ends 106, 108 respectively, corresponding to the staggered enlarged ends 32 of leads 30 (see FIG. 13) and to the enlarged ends 98 of change leads 94. In this fashion, signal leads 30 are connected to change leads 94 on the engineering change board, and through the engineering change boards the leads can be selectively coupled to corresponding leads 30' in module 10' to exchange signals between the modules. The change leads 94 on engineering change board 92 can also be used to connect signal leads 30 to other elements in the system.

While preferred embodiments of the present invention have been illustrated in detail, it is apparent that modifications and adaptations of those embodiments will occur to those skilled in the art. However, it is to be expressly understood that such modifications and adaptations are within the spirit and scope of the present invention, as set forth in the following claims.

What is claimed is:

1. A semiconductor chip module comprising:
    a semiconductor chip having a front face with a two dimensional array of power, ground and signal contacts formed thereon;
    a connector plate immediately adjacent the semiconductor chip and having power conductor means, ground conductor means, and signal conductor means electrically coupled to the respective contacts on the front face of the chip, said power, ground and signal conductor means being resiliently mounted on the connector plate;
    a pair of discrete electrically conductive plates adjacent and parallel to the connector plate, wherein the electrically conductive plate which is nearer the connector plate is electrically coupled to either the power or ground conductor means and contains apertures in a pattern corresponding to the remaining conductor means on the chip;
    a sheet including a plurality of discrete signal transmission members arranged in a pattern corresponding to that of the signal contacts on the chip and located proximate the electrically-conductive plate which is farther from the connector plate, whereby a layered structure including the chip, the connector plate, the pair of electrically-conductive plates, and the sheet is formed; and
    means extending through the apertures in the electrically-conductive plate which is nearer the connector plate for electrically coupling either the ground or power conductor means to the electrically-conductive plate which is farther from the connector plate and the signal conductor means to the respective signal transmission members on the sheet.

2. The module of claim 1 wherein the nearer electrically-conductive plate has an applied voltage and constitutes a power plate, the power conductor means being electrically coupled to said power plate.

3. The module of claim 2 wherein the power plate including the interior of the apertures is coated with an electrically insulative material.

4. The module of claim 1 wherein the signal transmission members include a plurality of signal leads enclosed in layers of an electrically insulative film.

5. The module of claim 4 wherein the sheet having the signal leads enclosed in the insulative film are located between the electrically conductive plates.

6. The module of claim 4 wherein the leads extend outwardly beyond at least one of the conductive plates, and additionally comprising an engineering change board having change leads corresponding to the signal leads and means for altering the path of the change leads, and means for coupling the signal leads to the change leads on the engineering change board.

7. The module of claim 6 wherein the lead coupling means comprises a bridge containing bridge leads extending from the signal leads to the change leads.

8. The module of claim 1 wherein the discrete signal transmission members are located on the side of the farther plate remote from the semiconductor chip, wherein said farther plate includes apertures corresponding to the signal conductor means, and wherein the electrically coupling means includes means extending through the apertures in both conductive plates for electrically coupling the signal conductor means to the respective signal transmission members.

9. The module of claim 8 wherein the signal transmission members comprise pins oriented perpendicular to the front face of the semiconductor chip.

10. A semiconductor chip module comprising:
a semiconductor chip having a front face with a two dimensional array of power and signal contacts formed thereon;
a connector plate immediately adjacent the chip and having power conductor means and signal conductor means, electrically coupled to the respective contacts on the front face of the chip;
an electrically conductive power plate parallel to the front face of the chip located adjacent the connector plate, the power plate being electrically coupled to the power conductor means and containing apertures corresponding to the signal conductor means;
an electrically insulating sheet having a plurality of discrete signal transmission members, said sheet being on the side of the power plate remote from the semiconductor ship; and
means extending through the apertures in the power plate to electrically couple the signal conductor means to the respective signal transmission members.

11. The module of claim 10 wherein the two dimensional array of contacts include ground contacts, and additionally comprising ground conductor means extending from the ground contacts, an electrically conductive ground plate parallel to the power plate on the side of the power plate opposite from the semiconductor chip, and means extending through certain of the apertures in the power plate to electrically couple the ground conductor means to the ground plate.

12. The module of claim 11 wherein the sheet having the signal transmission members are located between the power and ground plates.

13. The module of claim 12 wherein the sheet having the signal transmission members comprises a plurality of signal leads enclosed between layers of an electrically insulative film.

14. The module of claim 11 wherein the signal transmission members are located on the side of the ground plate opposite from the power plate.

15. The module of claim 14 wherein the signal transmission members comprise pins oriented perpendicular to the front face of the semiconductor chip and projecting outwardly from the ground plate.

16. The module of claim 10 wherein the power plate including the interior of the apertures is coated with an electrically insulative material.

17. A semiconductor chip module comprising:
a semiconductor chip having a front face with a two dimensional array of power, ground and signal contacts formed thereon;
a connector plate immediately adjacent the chip and having power conductor means, ground conductor means, and signal conductor means electrically coupled to the respective contacts on the front face of the chip;
a pair of discrete electrically conductive plates adjacent and parallel to the connector plate, wherein one of said plates is nearer the connector plate and the other of said plates is further from the connector plate, the electrically-conductive plate nearer the connector plate being electrically coupled to one of either the power or ground conductor means and containing apertures in a pattern corresponding to and aligned with the other of the power or ground conductor means on the chip;
a sheet comprising a plurality of signal leads enclosed in parallel layers of an electrically insulative film and located between the electrically conductive plates, said leads each having an interior end corresponding to a respective aperture in the nearer plate aligned with a signal conductor means and an exterior end located at the periphery of the film; and
means extending through the apertures in the nearer plate for electrically coupling the remaining ground or power conductor means not coupled to the nearer plate to the farther plate and for electrically coupling the signal conductor means to the respective signal leads.

18. The module of claim 17 wherein the interior end of each signal lead is enlarged, and wherein the electrically coupling means includes electrically conductive posts extending from the signal conductor means through the aligned apertures and penetrating one layer of electrically insulative material to engage the enlarged end of the associated signal lead.

19. The module of claim 18 wherein the exterior end of each signal lead is exposed.

20. The module of claim 19 and additionally comprising an engineering change board having change leads corresponding to the signal leads and means for altering the path of the change leads, and means for coupling the signal leads to the change leads on the engineering change board.

21. The module of claim 20 wherein the lead coupling means comprises a bridge containing bridge leads extending from the signal leads to the change leads.

22. The module of claim 21 wherein the exterior ends of the leads are staggered, and wherein the bridge contains staggered bridge leads corresponding to the staggered exterior lead ends.

23. The module of claim 17 wherein the nearer electrically-conductive plate has an applied voltage and constitutes a power plate, the power conductor means being electrically coupled to said power plate.

24. A semiconductor chip module comprising:
a semiconductor chip having a front face with a two dimensional array of power, ground and signal contacts formed thereon;
a connector plate immediately adjacent the semiconductor chip and having power, ground and signal conductor means electrically coupled to respective contacts on the front face of the chip;
a pair of discrete electrically conductive plates adjacent and parallel to the connector plate, wherein one of said plates is nearer the connector plate and the other of said plates is further from the connector plate, said nearer plate being electrically coupled to one of either the power or ground conductor means and containing apertures in a pattern corresponding to and aligned with the other of the power or ground conductor means on the chip, and the farther plate having apertures corresponding to the signal conductor means;
means extending through the apertures in the nearer electrically conductive plate aligned with said remaining ground or power connector means not coupled to the nearer electrically conductive plate for electrically coupling said remaining ground or power conductor means to the farther plate;

a plurality of pins projecting outwardly from the farther plate; and means extending through the apertures in the plates corresponding to the signal conductor means for electrically coupling said signal conductor means to the respective pins.

25. The module of claim 24 wherein the nearer plate has an applied voltage and constitutes a power plate, and wherein the farther plate is connected to ground and constitutes a ground plate.

26. The module of claim 1, 10, 17 or 24 and additionally comprising a heat sink with a flat surface, the semiconductor chip having a back face attached flush to the flat surface of the heat sink.

27. The module of claim 26 wherein the heat sink is water cooled.

28. The module of claim 1, 10, 17 or 24 wherein the chip has an area of about 3,600 square millimeters.

29. Apparatus for interconnecting semiconductor chips comprising:

a module which supports a semiconductor chip and includes an edge having a row of exposed signal lead ends and means internal to the module electrically coupling the signal lead ends with signal contacts on the semiconductor chip;

an engineering change board having change leads corresponding to the signal lead ends and means for altering the path of the change leads; and a bridge containing bridge leads extending from the signal lead ends to the change leads.

30. The apparatus of claim 29 wherein the signal lead ends are staggered and wherein the bridge contains staggered bridge leads corresponding to the staggered signal lead ends.

31. The apparatus of claim 29 and additionally comprising signal leads enclosed between layers of an electrically insulated film internal to the module and terminating at the signal lead ends.

32. The apparatus of claim 31 wherein the module includes power and ground plates, and wherein the leads enclosed in the layers of film are located between the power and ground plates.

33. Apparatus for providing power and ground to a semiconductor chip having a front face with a two dimensional array of power and ground contacts formed thereon, said apparatus comprising:

an electrically conductive power plate parallel to the front face of the chip and containing apertures corresponding to the ground contacts;

means for electrically coupling the power contacts on the front face of the chip with the power plate;

an electrically conductive ground plate parallel to the power plate on the side of the power plate opposite from the semiconductor chip; and means extending through the apertures in the power plate for electrically coupling the ground contacts on the front face of the chip to the ground plate.

34. The apparatus of claim 33 wherein the power plate including the interior of the apertures is coated with an electrically insulative material.

35. The apparatus of claim 34 wherein the ground electrically coupling means comprises ground posts electrically coupled to the ground contacts extending through the insulated apertures in the power plate and into contact with the ground plate.

36. The apparatus of claim 35 wherein the ground plate includes apertures corresponding to the apertures in the power plate, and wherein the ground posts extend into the apertures in the ground plate and make intimate contact with the ground plate.

37. The apparatus of claim 33 wherein the two dimensional array of contacts include signal contacts and the power plate includes apertures corresponding to the signal contacts, and additionally comprising discrete signal transmission means located at a surface of the ground plate, and means extending through the apertures for electrically coupling the signal contacts to the respective signal transmission means.

38. The apparatus of claim 37 wherein the signal transmission means comprises signal leads enclosed in parallel layers of an electrically insulative material.

39. The apparatus of claim 38 wherein the leads in the electrically insulative material are located between the power and ground plates.

40. The apparatus of claim 37 wherein the signal transmission means comprise pins located at the far surface of the ground plate, and additionally comprising apertures in the ground plate, the signal electrically coupling means extending through the apertures in the ground plate.

41. Apparatus for providing power and ground and signal connections to a semiconductor chip having a front face with a two dimensional array of power, ground and signal contacts formed thereon, said apparatus comprising;

an electrically conductive power plate parallel to the front face of the chip and containing apertures corresponding to the ground and signal contacts, the power plate including the interior of the apertures being coated with an electrically insulative material;

means for electrically coupling the power contacts on the front face of the chip with the power plate;

an electrically conductive ground plate parallel to the power plate on the side of the power plate opposite from the semiconductor chip;

means extending through the apertures in the power plate corresponding to the ground contacts for electrically coupling the ground contacts on the front face of the chip to the ground plate;

a plurality of discrete signal transmission leads enclosed in parallel layers of an electrically insulative material located between the power and ground leads; and means extending through the apertures in the power plate corresponding to the signal contacts for electrically coupling the signal contacts on the front face of the chip to the respective signal leads.

42. The apparatus of claim 41 wherein the leads extend laterally beyond the periphery of one of the plates and terminate in exposed, enlarged exterior ends, and additionally comprising an engineering change board having change leads corresponding to the signal leads, and a bridge including bridge leads interconnecting the exterior ends of the signal leads with respective change leads on the engineering change board.

43. The apparatus of claim 41 wherein the signal electrically coupling means includes electrically conductive posts coupled to the signal contacts and extending through the apertures in the power plate corresponding to the signal contacts through one layer of electrically insulative material to contact the respective leads.

44. The apparatus of claim 29, 33 or 41 wherein the semiconductor chip has an area of approximately 3,600 square millimeters.

* * * * *